United States Patent
Fukuda et al.

(10) Patent No.: US 8,956,554 B2
(45) Date of Patent: Feb. 17, 2015

(54) GREEN LIGHT-EMITTING SILICATE PHOSPHOR

(71) Applicant: Ube Material Industries, Ltd., Ube-shi, Yamaguchi (JP)

(72) Inventors: Kouichi Fukuda, Ube (JP); Jin Amagai, Ube (JP); Toru Inagaki, Ube (JP)

(73) Assignee: Ube Materials Industries, Ltd., Ube-shi, Yamaguchi (JP)

( * ) Notice: Subject to any disclaimer, the term of this patent is extended or adjusted under 35 U.S.C. 154(b) by 255 days.

(21) Appl. No.: 13/729,314

(22) Filed: Dec. 28, 2012

(65) Prior Publication Data

US 2013/0168604 A1    Jul. 4, 2013

(30) Foreign Application Priority Data

Dec. 28, 2011  (JP) .................. 2011-288727

(51) Int. Cl.
- *C09K 11/59* (2006.01)
- *C09K 11/55* (2006.01)
- *C09K 11/77* (2006.01)

(52) U.S. Cl.
CPC .................. *C09K 11/7734* (2013.01)
USPC .................................... 252/301.4 F

(58) Field of Classification Search
USPC ...................................... 252/301.4 F
See application file for complete search history.

(56) References Cited

U.S. PATENT DOCUMENTS

2011/0304264 A1 * 12/2011 Winkler .................. 313/504

FOREIGN PATENT DOCUMENTS

| JP | 2007-238814 | 9/2007 |
| JP | 2008-088399 | 4/2008 |
| JP | 2010-003790 | 1/2010 |

* cited by examiner

*Primary Examiner* — Carol M Koslow
(74) *Attorney, Agent, or Firm* — Nixon Peabody LLP; Jeffrey L. Costellia

(57) ABSTRACT

A green light-emitting silicate phosphor comprising Eu-activated strontium barium silicate which has a crystal phase of magnesium oxide or a merwinite crystal phase and contains 0.15 to 0.90 mol of magnesium per one mol of silicon gives a light emission stable at elevated temperatures.

7 Claims, 4 Drawing Sheets

(a)

(b)

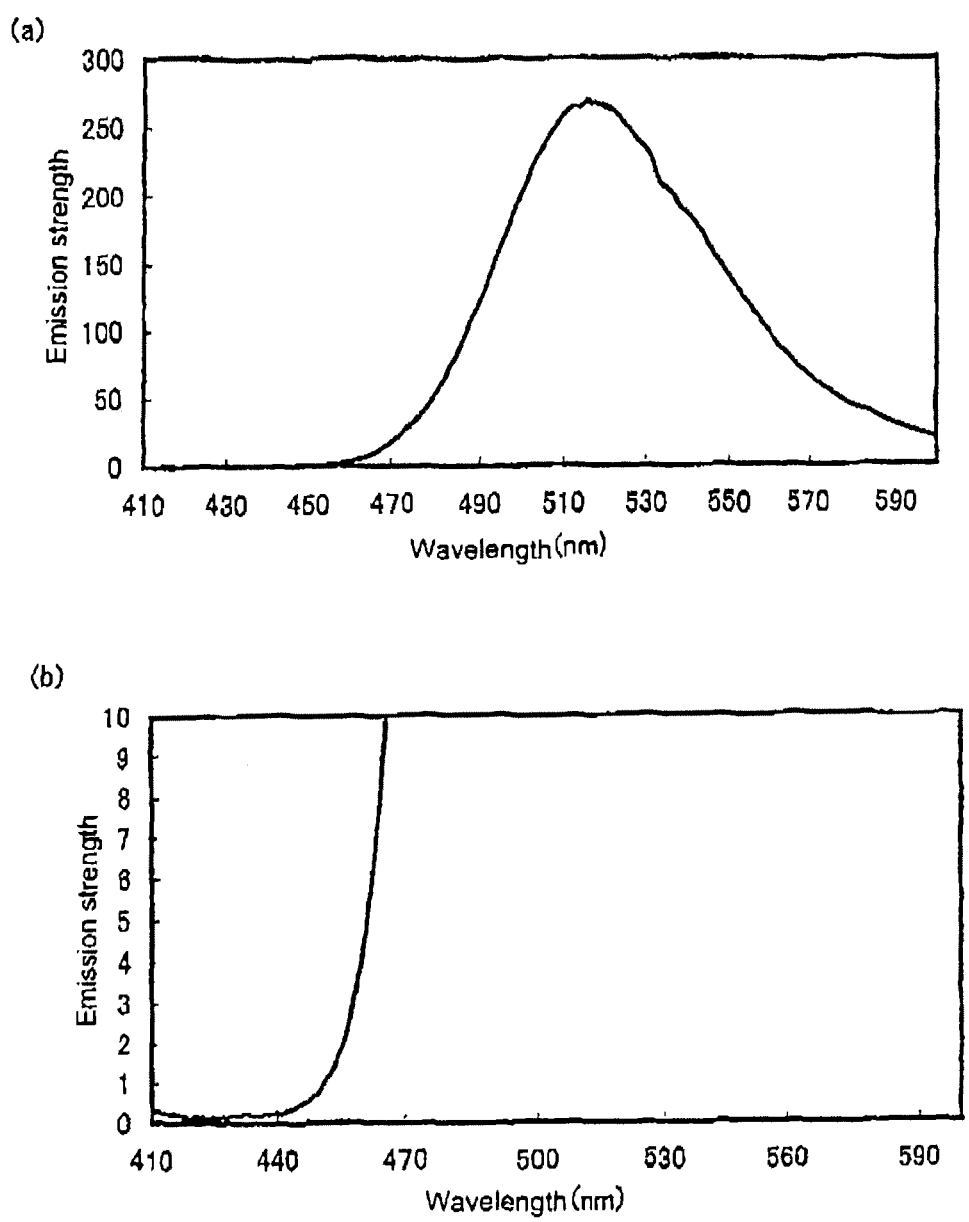

GREEN LIGHT-EMITTING SILICATE PHOSPHOR

FIELD OF THE INVENTION

The present invention relates to a silicate phosphor which is of a value as a green light-emitting material.

BACKGROUND OF THE INVENTION

Until a recent date, widely utilized white light-emitting LEDs have been of a double color admixture type of which white light is produced by mixing a blue light released from a semiconductor light-emitting element upon activation by electric energy and a yellow light emitted from a yellow light-emitting phosphor upon excitation with the blue light from the semiconductor light-emitting element. However, there is a problem in the white light emitted from the white light-emitting LED of the double color admixture type, in that the white light is not sufficiently pure. Therefore, there have been studied white light-emitting LEDs of a triple color admixture type which give a white light by mixing a blue light, a green light and a red light. The blue light, green light and red light are all released respectively from a blue light-emitting phosphor, a green light-emitting phosphor and a red light-emitting phosphor by excitation with a light in the wavelength region of 350 to 430 nm which is released from a semiconductor light-emitting element by applying thereto electric energy.

As the green light-emitting phosphor, there have been known green light-emitting silicate phosphors such as an alkaline earth metal silicate phosphor (e.g., strontium barium silicate) activated with europium.

For example, Patent publication 1 (JP 2008-88399 A) discloses a green light-emitting silicate phosphor having the following formula:

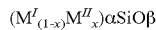

$(M^I_{(1-x)}M^{II}_x)\alpha SiO\beta$ wherein $M^I$ is at least one element selected from the group consisting of Ba, Ca, Sr, Zn and Mg; $M^{II}$ is at least one divalent or trivalent metal element; each of x, α and β satisfies the conditions of 0.01<x<0.3, 1.5≤α≤2.5, and 3.5≤β≤4.5.

Patent publication 1 describes that $M^I$ preferably comprises Ba and Sr and that [Ba] and [Sr] preferably satisfy the conditions of 0.5<{[Ba]/([Ba]+[Sr])}≤1, wherein [Ba] is a molar ratio of Ba based on the total mol of Ba and Sr comprised in $M^I$ and [Sr] is a molar ratio of Sr based on the total mol of Ba and Sr.

Patent publication 2 (JP 2007-238814 A) discloses that a green light-emitting phosphor having the formula of $Sr_xBa_{2-x}SiO_4$:Eu (0≤x≤2) shows increased excitation efficiency in the blue light-emission region when a magnesium salt is added. The magnesium salts described in Patent publication 2 are magnesium chloride, magnesium sulfate, and magnesium fluoride.

Patent publication 3 (JP 2010-3790 A) has a description referring to the working temperatures of LED. In more detail, it is described that the LED chip (i.e., semiconductor light-emitting element) generates so heat that the temperature of LED chip reaches 120° C., when the LED is continuously operated for a long period of time or activated by large electric current for the purpose of increasing the light-emitting strength. Therefore, it is required that the phosphor for the use as a light-emitting source of a white light-emitting LED shows a light emission not substantially varying with the temperature variation caused by the heat generation caused during the operation of LED. In other words, the phosphor should be stable at elevated temperatures in the vicinity of 120° C.

SUMMARY OF TEE INVENTION

As is disclosed in Patent publication 3, the phosphor used in the white light-emitting LED is required to show a light emission whose emission strength is not substantially variable in the temperature range from room temperature to around 120° C. However, the study made by the present inventors revealed that green light-emitting silicate phosphors such as strontium barium silicate activated with Eu likely show lowering of the emission strength when the circumferential temperature elevates.

Accordingly, it is the object of the invention to provide a green light-emitting silicate phosphor giving a stable light emission regardless of the temperature elevation.

As a result of the further study, the inventors have found that the stability of strength of emission released from a green light-emitting silicate phosphor, typically Eu-activated strontium barium silicate, under the temperature elevating conditions increases when the green light-emitting silicate phosphor is caused to contain a crystal phase of magnesium oxide or a merwinite crystal phase, for example, by incorporation of 0.15 to 0.90 mol of magnesium per one mol of silicon. From one aspect, the invention disclosed herein has been made based on the above-mentioned new finding.

From one aspect, the present invention resides in a green light-emitting silicate phosphor comprising Eu-activated strontium barium silicate which contains a crystal phase of magnesium oxide or a merwinite crystal phase.

Preferred embodiments of the invention are described below.

(1) The green light-emitting silicate phosphor contains 0.15 to 0.90 mol of magnesium per one mol of silicon.

(2) The green light-emitting silicate phosphor has both of a crystal phase of magnesium oxide and a merwinite crystal phase.

(3) The green light-emitting silicate phosphor has the crystal phase of magnesium oxide and gives an X-ray diffraction pattern given by utilizing CuKα ray of an angle θ of incidence in which a relative strength of a diffraction peak attributed to the crystal phase of magnesium oxide in the region of 42.8° to 43.1° in terms of 2θ is in the range of 0.02 to 0.20 per 1 of a strength of diffraction peak attributed to crystal phase of the strontium barium silicate in the region of 31.3° to 31.6° in terms of 2θ.

(4) The green light-emitting silicate phosphor has the merwinite crystal phase and gives an X-ray diffraction pattern given by utilizing CuKα ray of an angle θ of incidence in which a relative strength of a diffraction peak attributed to the merwinite crystal phase in the region of 32.4° to 32.7° in terms of 2θ is in the range of 0.02 to 0.50 per 1 of a strength of diffraction peak attributed to crystal phase of the strontium barium silicate in the region of 31.3° to 31.6° in terms of 2θ.

(5) The green light-emitting silicate phosphor is produced by calcining a powdery mixture comprising a powdery strontium compound, a powdery barium compound, a powdery silicon compound and a powdery europium compound in a ratio giving a Eu-activated green light-emitting phosphor and further comprising a powdery magnesium compound in an amount of 0.15 to 0.90 mol in terms of magnesium amount per one mol of the amount of silicon.

(6) The green light-emitting silicate phosphor releases a green light-emission showing an emission peak in the wavelength region of 510 to 530 nm when it is excited by a light having the wavelength of 400 nm and further releases a blue light-emission showing an emission peak in the wavelength region of 435 to 450 nm in which the emission peak has an emission strength in the range of 0.0015 to 0.020 per 1 of the strength of the emission peak of the green light-emission.

The green light-emitting silicate phosphor of the invention has increased resistance to heat and hence releases a green light-emission whose emission strength is stable in the temperature range from room temperature to 100° C. or higher, such as up to approx. 120° C. Therefore, the green light-emitting silicate phosphor of the invention is favorably employable as the green light-emitting source for forming a light emitting device such as a white light-emitting LED which likely generates heat in its working so that the LED may be heated to a high temperature such as approx. 120° C.

BRIEF DESCRIPTION OF DRAWINGS

FIG. 5 shows emission spectra of the green light-emitting silicate phosphor obtained in Comparison Example 1, in which (a) shows an emission spectrum in the wavelength region of 410 to 590 nm and (b) shows an enlarged emission spectrum in the vicinity of the wavelength of 440 nm.

DETAILED DESCRIPTION OF TIM INVENTION

Figure 1:
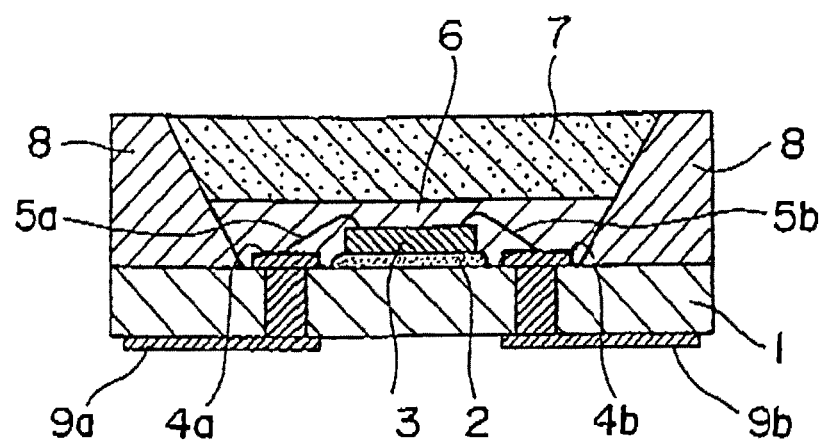
FIG. 1 shows a section of a white light-emitting LED employing a green light-emitting silicate phosphor of the invention.

The green light-emitting silicate phosphor of the invention comprises, as a principal ingredient, strontium barium silicate activated with europium, which preferably is a compound having the following formula (I):

$x\text{BaO}.y\text{SrO}.z\text{Euo}.\text{SiO}_2$     (I)

in which each of x and y independently is in the range of 0.10 to 2.00, and z is in the range of 0.005 to 0.20, provided that x+y+z is in the range of 1.50 to 2.50.

Each of x and y preferably is in the range of 0.50 to 1.50, more preferably is in the range of 0.70 to 1.20, most preferably is in the range of 0.80 to 1.10. It is preferred that z is in the range of 0.01 to 0.10, more preferably in the range of 0.02 to 0.07. It is preferred that x+y+z is in the range of 1.70 to 2.10, more preferably in the range of 1.80 to 1.98.

The green light-emitting silicate phosphor of the invention further contains magnesium. The silicate phosphor generally comprises magnesium in an amount of 0.15 to 0.90 mol, preferably in an amount of 0.20 to 0.80 mol per one mol of silicon. In the silicate phosphor, magnesium forms a crystal phase of magnesium oxide or a merwinite crystal phase. The merwinite crystal phase means a crystal phase of a compound having the same crystal structure as that of merwinite $(\text{Ca}_3\text{MgSi}_2\text{O}_8)$. It is understood that the crystal structure of $(\text{Ba,Sr})_3\text{MgSi}_2\text{O}_8$ analogous to the crystal structure of merwinite is formed in the silicate phosphor of the invention. The crystal phase of magnesium oxide and/or merwinite crystal phase may be formed in the crystal phase of the green light-emitting silicate phosphor, in the intergranular areas of the crystal phase of the silicate phosphor, or on the surface of the phosphor particle.

The green light-emitting silicate phosphor of the invention preferably contains both of the crystal phase of magnesium oxide and merwinite crystal phase. All of the magnesium contained in the green light-emitting phosphor of the invention not necessary forms the crystal phase of magnesium oxide or the merwinite phosphor. A portion of magnesium may form magnesium silicate.

The presence of the crystal phase of magnesium oxide and the merwinite crystal phase in the green light-emitting silicate phosphor can be confirmed from an X-ray diffraction pattern given by the silicate phosphor.

The crystal phase of magnesium oxide can be identified by an X-ray diffraction pattern given by utilizing CuKα ray of an angle θ of incidence in which a relative strength of a diffraction peak attributed to the crystal phase of magnesium oxide in the region of 42.8° to 43.1° in terms of 2θ is in the range of 0.02 to 0.20 per 1 of a strength of diffraction peak attributed to crystal phase of the strontium barium silicate in the region of 31.3° to 31.6° in terms of 2θ.

The merwinite crystal phase can be identified by an X-ray diffraction pattern given by utilizing CuKα ray of an angle θ of incidence in which a relative strength of a diffraction peak attributed to the merwinite crystal phase in the region of 32.4° to 32.7° in terms of 2θ is in the range of 0.02 to 0.50 per 1 of a strength of diffraction peak attributed to crystal phase of the strontium barium silicate in the region of 31.3° to 31.6° in terms of 2θ.

The green light-emitting silicate phosphor of the invention preferably releases a green light-emission showing an emission peak in the wavelength region of 510 to 530 nm when it is excited by a light having the wavelength of 400 nm and further releases a blue light-emission showing an emission peak in the wavelength region of 435 to 450 nm in which the emission peak has an emission strength in the range of 0.0015 to 0.020, preferably 0.005 to 0.010, per 1 of the strength of the emission peak of the green light-emission.

The green light-emitting silicate phosphor of the invention can be produced by calcining a powdery mixture comprising a powdery strontium compound, a powdery barium compound, a powdery silicon compound and a powdery europium compound in a ratio giving a Eu-activated green light-emitting phosphor and further comprising a powdery magnesium compound in an amount of 0.15 to 0.90 mol in term of magnesium per one mol of the amount of silicon.

Each of the powdery strontium compound, powdery barium compound, powdery silicon compound, powdery europium compound and powdery magnesium compound can be a powdery oxide or a powder of hydroxide, halide, carbonate (including basic carbonate), nitrate, or oxalate which produces an oxide powder by calcination. Each powdery compound preferably has a purity of 99 wt. % or more. One or more powdery compounds can be used as each metal source.

The powdery mixture may contain one or more flux. The flux preferably is halide, more preferably is chloride. The chloride flux can be one of the metal oxide-forming compound. Preferably, a powdery strontium chloride is employed as the metal oxide-forming compound and flux. The flux is mixed in an amount of 0.0001 to 0.5 mol, preferably in an amount of 0.01 to 0.5 mol, in terms of the halogen content, per one mol of the silicon content.

The powder mixture can be produced by any one of the known dry mixing process and wet mixing process. For example, the wet mixing process can be carried out by means of a rotating ball mill, a vibrating ball mill, a planetary mill, a paint shaker, a locking mill, a bead mill, or a stirrer. In the wet mixing process, a solvent such as water or a lower alcohol (e.g., ethanol or isopropanol) can be employed.

The calcination of the powdery mixture can be performed in a reducing gas atmosphere. The reducing gas can be a mixture of 0.5 to 5.0 vol. % of hydrogen and 99.5 to 95.0 vol. % of an inert gas such as argon or nitrogen. The calcination can be carried out generally at 900 to 1,300° C. for a period of time in the range of 0.5 to 100 hours, preferably in the range of 0.5 to 10 hours.

If the powdery compound is a powder of a compound producing an oxide by calcination, the powdery compound is preferably pre-calcinated at 600 to 850° C. for 0.5 to 100 hours, preferably 0.5 to 10 hours, in atmospheric conditions. The calcined mixture can be post-treated by such procedures as classification, acid treatment using a mineral acid such as hydrochloric acid or nitric acid, or baking.

The green light-emitting silicate phosphor of the invention releases a green light emission when excited with a light of vacuum UV light or a blue light. Therefore, the green light-emitting silicate phosphor of the invention is favorably employable as the green light-emitting source for a variety of light-emitting devices such as plasma display panels and white light-emitting LEDs.

The light-emitting device employing the green light-emitting silicate phosphor of the invention is described below, referring to the attached FIG. 1.

FIG. 1 is a section of one embodiment of the white light-emitting LED according to the three color mixing type.

In FIG. 1, the white light-emitting LED comprises a base 1, a semiconductor light-emitting element 3 fixed onto the base 1 via an adhesive 2, a pair of electrodes 4a,4b formed on the base 1, electric leads 5a,5b electrically connecting the semiconductor light-emitting element 3 with the electrodes 4a,4b, a resin layer 6 covering the semiconductor light-emitting element 3, a phosphor-containing resin composition layer 7 formed on the resin layer 6, a light-reflecting material 8 covering the resin layer 6 and phosphor layer 7, and electric wires 9a,9b connecting the electrodes 4a,4b with an outside electric source (not shown).

The base 1 preferably has a high electric insulating property and a high heat conductivity. Examples of the bases include bases made of ceramic materials such as alumina and aluminum nitride and plastic bases in which inorganic particles (e.g., metal oxide particles and glass particles) are dispersed. The semiconductor light-emitting element 3 preferably emits a light in the wavelength region of 350 to 430 nm by application of electric energy. The semiconductor light-emitting element 3 can be an AlGaN type light-emitting semiconductor element.

The resin layer 6 can be made of transparent resin. Examples of the transparent resin include epoxy resin and silicon resin. The phosphor-containing resin composition layer 7 is formed of a phosphor-containing resin composition in which a blue light-emitting phosphor, a green light-emitting phosphor and a red light-emitting phosphor are dispersed in resinous binder material. The green light-emitting phosphor comprises a green light-emitting silicate phosphor of the invention. The blue light-emitting phosphor can be $(Ba,Sr,Ca)_3MgSi_2O_7$:Eu, $(Ba,Sr,Ca)MgAl_{10}O_{17}$:Eu, or $(Ba,Sr,Mg,Ca)_{10}(PO_4)_6(Cl,F)_2$:Eu. The red light-emitting phosphor can be $(Ba,Sr,Ca)_3MgSi_2O_8$:Eu,Mn, $Y_2O_2S$:Eu, $La_2O_3S$:Eu, $(Ca,Sr,Ba)_2Si_5N_8$:Eu, $CaAlSiN_3$:Eu, $Eu_2W_2O_9$, $(Ca,Sr,Ba)_2Si_5N_8$:Eu,Mn, $CaTiO_3$:Pr,Bi, or $(La,Eu)_2W_3O_{12}$.

The light-reflecting material 8 serves to reflect the visible light released from the phosphor-containing resin composition layer 7 to direct it outside. Therefore, the emission efficiency of the visible light increases. The light-reflecting material 8 can be formed of a metal such as Al, Ni, Fe, Cr, Ti, Cu, Rh, Ag, Au or Pt, or a white metal compound such as alumina, zirconia, titania, magnesia, zinc oxide, or calcium carbonate dispersed in resinous material.

When electric energy is applied to the electrodes 4a,4b of the white light-emitting LED via the electric wires 9a,9b in the white light-emitting LED, the semiconductor light-emitting element 3 releases a light emission having a peak in the wavelength region of 350 to 430 nm. The released light emission then excites each of the light-emitting phosphors in the phosphor-containing resin composition layer 7 to release visible lights such as a blue light, a green light, and a red light. The thus released blue light, a green light, and a red light mix altogether to produce a white light.

The white light-emitting LED can be manufactured in the below-described manner.

On the base 1 are formed the electrodes 4a,4b in the predetermined pattern. Subsequently, the light-emitting semiconductor element 3 is fixed onto the base via the adhesive 2, and the lead lines 5a,5b are formed to bond the semiconductor element 3 to the electrodes 4a,4b via wire-bonding. The light-reflecting material 8 is then fixed around the semiconductor element 3, and the transparent resinous material is spread over the semiconductor element 3. The spread transparent resinous material is cured to form a resin layer 6. Over the resin layer 6 is spread a phosphor-containing resin composition, and the spread phosphor-containing resin composition is cured to form the phosphor-containing resin composition layer 7.

The white light-emitting LED can comprise a phosphor-containing glass composition layer in place of the phosphor-containing resin composition layer. The green light-emitting silicate phosphor of the invention can be incorporated into the phosphor-containing glass composition layer.

Example 1

A powdery strontium carbonate (purity: 99.99 wt. %, mean particle size: 2.73 μm), a powdery barium carbonate (purity: 99.8 wt. %, mean particle size: 1.26 μm), a powdery magnesium oxide (prepared by a gas phase oxidation method, purity: 99.98 wt. %, BET specific surface area: 8 m²/g), a powdery silicon dioxide (purity: 99.9 wt. %, mean particle size: 3.87 μm), a powdery dieuropium trioxide (purity: 99.9 wt. %, mean particle diameter: 2.71 μm), and a powdery strontium chloride (purity: 99.9 wt. %) were weighed to give a powdery mixture in which a molar ratio of $SrCO_3:BaCO_3:MgO:SiO_2:Eu_2O_3:SrCl_2$ was 0.945:0.900:0.200:1:0.020:0.015. The mean particle diameters of the powdery materials were determined by the laser diffraction-scattering spectroscopy. The powdery materials and pure water were placed in a ball mill, and mixed for 24 hours, to give an aqueous slurry of the powdery mixture. The aqueous slurry was spray-dried to give a dry powdery mixture having a mean particle size of 40 μm.

The dry powdery mixture was placed in an alumina crucible and calcined at 800° C. for 3 hours in atmospheric conditions. The calcined powdery mixture was allowed to stand to room temperature, and subsequently calcined at 1,200° C. for 6 hours in the gaseous atmosphere comprising 2 vol. % of hydrogen and 98 vol. % of argon, to give a green light-emitting silicate phosphor.

Examples 2-12 and Comparison Examples 1-2

The procedures of Example 1 were repeated except that the molar ratio of $SrCO_3:BaCO_3:MgO:SiO_2:Eu_2O_3:SrCl_2$ was changed to that stated in the following Table 1, to give a green light-emitting silicate phosphor.

TABLE 1

|  | $SrCO_3$ | $BaCO_3$ | MgO | $SiO_2$ | $Eu_2O_3$ | $SrCl_2$ |
|---|---|---|---|---|---|---|
| Example 1 | 0.945 | 0.900 | 0.200 | 1 | 0.020 | 0.015 |
| Example 2 | 0.945 | 0.900 | 0.450 | 1 | 0.020 | 0.015 |
| Example 3 | 0.945 | 0.900 | 0.500 | 1 | 0.020 | 0.015 |
| Example 4 | 0.945 | 0.900 | 0.600 | 1 | 0.020 | 0.015 |
| Example 5 | 0.945 | 0.950 | 0.200 | 1 | 0.020 | 0.015 |
| Example 6 | 0.945 | 0.950 | 0.450 | 1 | 0.020 | 0.015 |
| Example 7 | 0.945 | 0.950 | 0.500 | 1 | 0.020 | 0.015 |
| Example 8 | 0.945 | 0.950 | 0.600 | 1 | 0.020 | 0.015 |
| Example 9 | 0.945 | 1.000 | 0.300 | 1 | 0.020 | 0.015 |
| Example 10 | 0.945 | 1.000 | 0.450 | 1 | 0.020 | 0.015 |
| Example 11 | 0.945 | 1.000 | 0.600 | 1 | 0.020 | 0.015 |
| Example 12 | 0.945 | 1.000 | 0.800 | 1 | 0.020 | 0.015 |
| Com. Ex. 1 | 0.945 | 1.000 | — | 1 | 0.020 | 0.015 |
| Com. Ex. 2 | 0.945 | 0.990 | 0.100 | 1 | 0.020 | 0.015 |

[Evaluation]

The green light-emitting silicate phosphors obtained in Examples 1-12 and Comparison Examples 1-2 were evaluate in the following properties:

(1) X-ray diffraction peak strengths of the crystal phase of magnesium oxide and merwinite crystal phase (2) Emission spectrum of the emission released at the excitation with a light having a wavelength of 400 nm (3) Stability of the strength of green light with variation of temperature (4) Particle size distribution.

(1) X-Ray Diffraction Peak Strengths of the Crystal Phase of Magnesium Oxide and Merwinite Crystal Phase The X-ray diffraction pattern (obtained by the continuous method) of the green light-emitting silicate phosphor was obtained under the below-mentioned conditions:

X-ray source: CuKα
Tube voltage: 40 kV
Tube current: 40 mA
Slit width for divergence: 0.3 deg.
Slit width for scattering: 0.3 deg.
Slit width for light reception: 5.56 mm
Scanning mode: 4 deg./min.
Scanning step: 0.005 deg.

Figure 2:
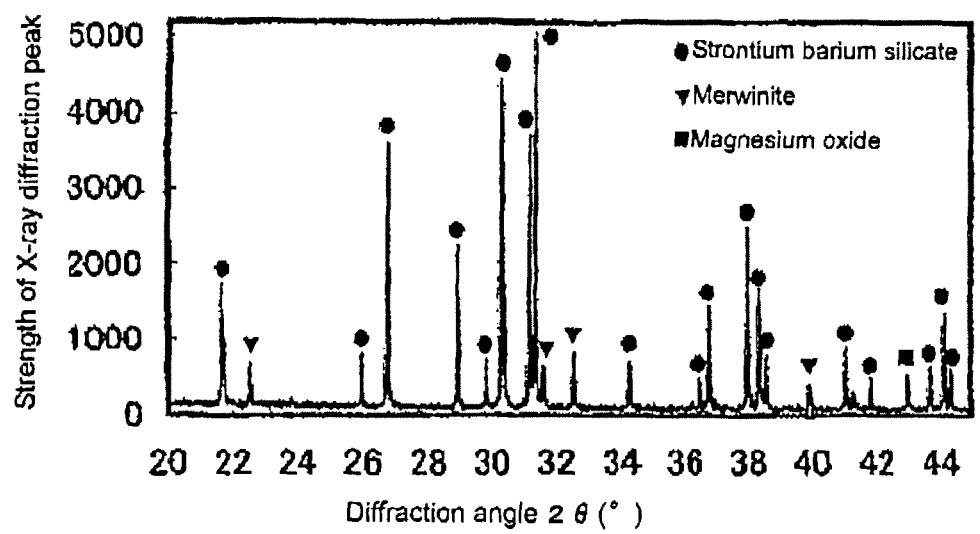
FIG. 2 is an X-ray diffraction pattern of the green light-emitting silicate phosphor obtained in Example 7.
Figure 3:
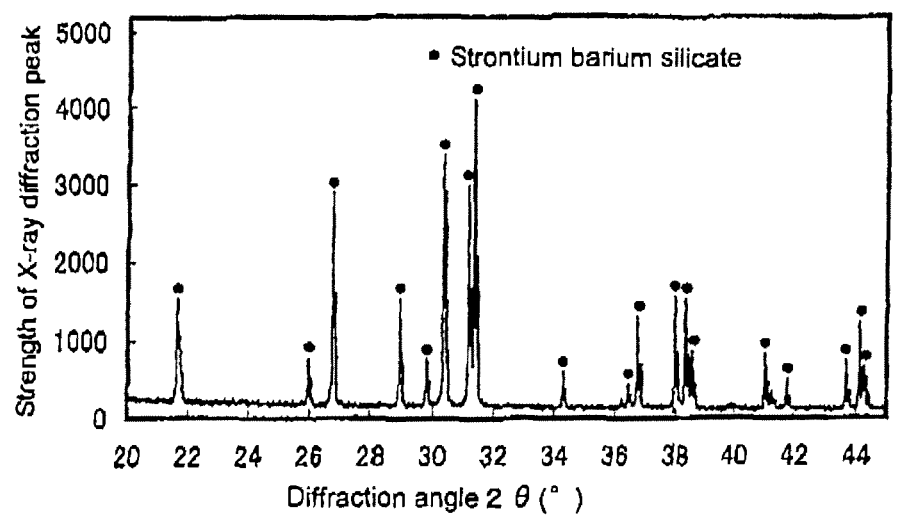
FIG. 3 is an X-ray diffraction pattern of the green light-emitting silicate phosphor obtained in Comparison Example 1.

In the attached drawings, FIG. 2 is an X-ray diffraction pattern of the green light-emitting silicate phosphor obtained in Example 7, and FIG. 3 is an X-ray diffraction pattern of the green light-emitting silicate phosphor obtained in Comparison Example 1. In comparison between FIG. 2 and FIG. 3, it is noted that the silicate phosphor of Comparison Example 1 contains a crystal phase of strontium barium silicate only, while the silicate phosphor of Example 7 contains a crystal phase of magnesium oxide and merwinite crystal phase in addition to the crystal phase of strontium barium silicate.

From the X-ray diffraction pattern, peak strengths of the crystal phase of magnesium oxide and merwinite crystal phase are determined. The peak strengths are expressed in terms of values relative to the strength (1) of the peak of the crystal phase of strontium barium silicate. The relative peak strength values are shown in Table 2. In the determination, the strength of X-ray diffraction peak of strontium barium silicate crystal was determined from the diffraction peak seen in the region of 31.3 to 31.6° in terms of 2θ; the strength of X-ray diffraction peak of the crystal phase of magnesium oxide was determined from the diffraction peak seen in the region of 42.8 to 43.1° in terms of 2θ; and the strength of X-ray diffraction peak of the merwinite crystal phase was determined from the diffraction peak seen in the region of 32.4 to 32.7° in terms of 2θ.

Figure 4:
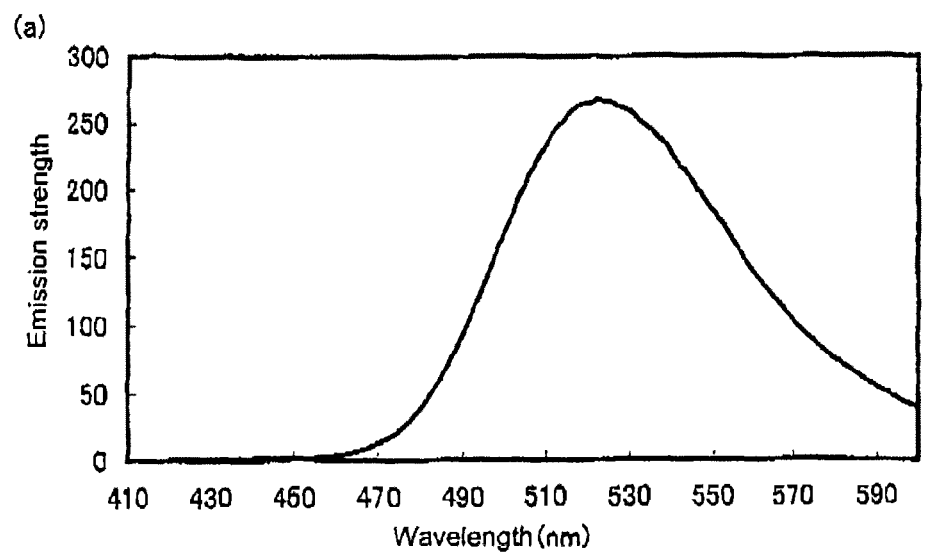
FIG. 4 shows emission spectra of the green light-emitting silicate phosphor obtained in Example 7, in which (a) shows an emission spectrum in the wavelength region of 410 to 590 nm and (b) shows an enlarged emission spectrum in the vicinity of the wavelength of 440 nm.
Figure 4:
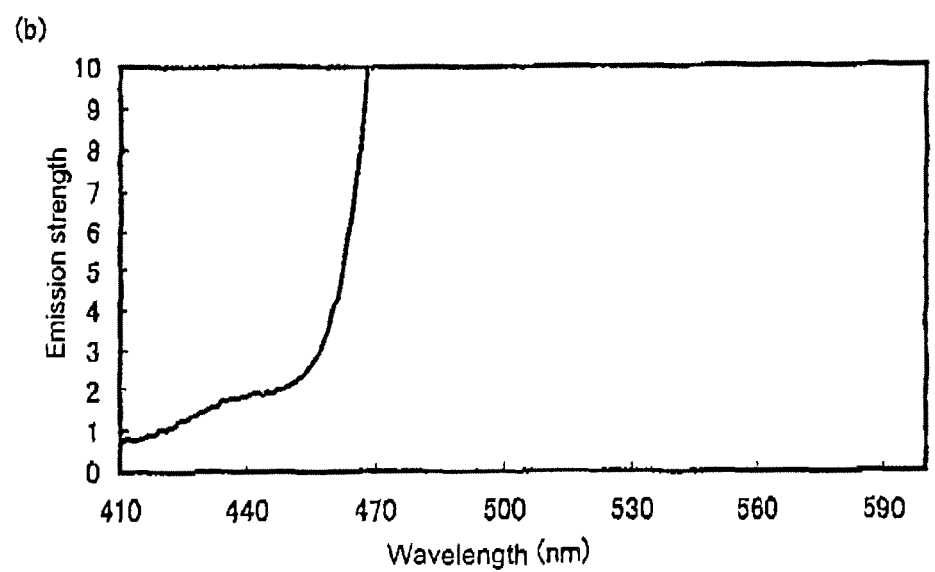

(2) Emission Spectrum of the Emission Released at the Excitation with a Light Having a Wavelength of 400 nm The green light-emitting silicate phosphor was exposed to irradiation with a light having the wavelength of 400 nm released from a Xenon lamp, for exciting the silicate phosphor to release a light emission. FIG. 4 shows emission spectra of the green light-emitting silicate phosphor obtained in Example 7, in which (a) shows an emission spectrum in the wavelength region of 410 to 590 nm and (b) shows an enlarged emission spectrum in the vicinity of the wavelength of 440 nm. FIG. 5 shows emission spectra of the green light-emitting silicate phosphor obtained in Comparison Example 1, in which (a) shows an emission spectrum in the wavelength region of 410 to 590 nm and (b) shows an enlarged emission spectrum in the vicinity of a wavelength of 440 nm. In comparison between FIG. 4 and FIG. 5, it is noted that the silicate phosphor of Comparison Example 1 releases only a green light having a peak in the wavelength region of 510 to 530 nm, while silicate phosphor of Example 7 releases a blue light having a peak in the wavelength region of 435 to 450 nm in addition to the green light.

A peak strength of the blue light relative to the peak strength of the peak strength (1) of the green light is shown in Table 2.

(3) Stability of the Strength of Green Light with Variation of Temperature

The green light-emitting silicate phosphor was heated at a temperature elevation rate of 10° C./min. In the course of heating the silicate phosphor, the heating was suspended when temperature of the silicate phosphor reached 25° C., 50° C., 100° C., and 150° C., respectively, and the silicate phosphor was exposed to a light having a wavelength of 400 nm released from a Xenon lamp, so as to cause light-emission from the silicate phosphor for obtaining an emission spectrum, after the temperature was kept for 5 min. and while the same temperature was kept. From the obtained emission spectrum, the strength of peak seen in the wavelength region of 510 to 530 nm was determined, to give an emission strength. The thus obtained emission strength is expressed in a value relative to the emission strength (100) determined for the silicate phosphor of each example which was heated to 25° C. The results are shown in Table 3.

(4) Particle Size Distribution

In a 100 mL-volume beaker were placed 0.2 g of the green light-emitting silicate phosphor and 40 mL of ethanol, and the silicate phosphor was well dispersed in ethanol for 3 min., by means of a homogenizer (Ultrasonic generator US-150T, available from Nihon Precision Machine Co., Ltd.) at 400 μA. The whole resulting dispersion was charged into a particle size analyzer (MICROTRAC HRA9320-X-100, available Nikkiso Co., Ltd.), to determine the particle distribution of the silicate phosphor. The determined particle distribution is shown in Table 3. In Table 3, $D_{10}$ means a size of opening of a sieve through which 10% of the particles are passed, $D_{50}$ means a size of opening of a sieve through which 50% of the particles are passed, and $D_{90}$ means a size of opening of a sieve through which 90% of the particles are passed.

TABLE 2

| | X-ray diffraction peak strength | | Emission peak |
|---|---|---|---|
| | Crystal phase of magnesium oxide | Merwinite crystal phase | strength of blue light |
| Example 1 | 0.050 | 0.304 | 0.0075 |
| Example 2 | 0.089 | 0.280 | 0.0135 |
| Example 3 | 0.108 | 0.320 | 0.0163 |
| Example 4 | 0.135 | 0.371 | 0.0172 |
| Example 5 | 0.054 | 0.046 | 0.0019 |
| Example 6 | 0.074 | 0.121 | 0.0076 |
| Example 7 | 0.106 | 0.164 | 0.0070 |
| Example 8 | 0.124 | 0.174 | 0.0080 |
| Example 9 | 0.059 | not detected | 0.0025 |
| Example 10 | 0.089 | not detected | 0.0022 |
| Example 11 | 0.127 | not detected | 0.0018 |
| Example 12 | 0.134 | not detected | 0.0016 |
| Com. Ex. 1 | not detected | not detected | not detected |
| Com. Ex. 2 | not detected | not detected | not detected |

Remarks:
1) X-ray diffraction peak strength for each of crystal phase of magnesium oxide and merwinite crystal phase is a value relative to the determined X-ray diffraction peak strength for strontium barium silicate as 1.
2) Emission peak strength of blue light is a value relative to the determined emission peak strength of green light as 1.

TABLE 3

| | Stability of emission strength of green light | | | | Particle size distribution | | |
|---|---|---|---|---|---|---|---|
| | 25° C. | 50° C. | 100° C. | 150° C. | $D_{10}$ | $D_{50}$ | $D_{90}$ |
| Example 1 | 100 | 95.6 | 87.1 | 75.6 | 8.1 | 43.2 | 190.2 |
| Example 2 | 100 | 96.0 | 89.7 | 79.2 | 4.2 | 8.8 | 11.1 |
| Example 3 | 100 | 95.4 | 89.3 | 78.1 | 3.2 | 5.5 | 10.9 |
| Example 4 | 100 | 96.4 | 88.8 | 77.7 | 4.6 | 6.3 | 9.7 |
| Example 5 | 100 | 95.6 | 87.9 | 77.6 | 6.2 | 47.3 | 217.6 |
| Example 6 | 100 | 95.8 | 88.7 | 78.8 | 3.8 | 6.2 | 9.2 |
| Example 7 | 100 | 97.0 | 91.0 | 79.6 | 3.1 | 5.3 | 11.2 |
| Example 8 | 100 | 96.8 | 89.5 | 78.6 | 4.3 | 6.6 | 10.1 |
| Example 9 | 100 | 95.8 | 87.6 | 72.7 | 7.7 | 49.8 | 210.5 |
| Example 10 | 100 | 97.2 | 88.5 | 74.5 | 3.1 | 5.0 | 8.2 |
| Example 11 | 100 | 96.7 | 88.2 | 73.2 | 3.1 | 5.3 | 11.1 |
| Example 12 | 100 | 96.0 | 87.2 | 72.4 | 2.5 | 4.8 | 8.0 |
| Com. Ex. 1 | 100 | 94.4 | 84.8 | 74.2 | 27.5 | 83.8 | 220.8 |
| Com. Ex. 2 | 100 | 94.9 | 85.0 | 72.9 | 7.7 | 62.2 | 209.5 |

From the results shown in Table 2 and Table 3, it is noted that the green light-emitting silicate phosphors containing the crystal phase of strontium barium silicate and the crystal phase of magnesium oxide (Examples 1-12) give retention of emission strength at 100° C. Higher than the green light-emitting silicate phosphors (Comparison Examples 1-2) containing the crystal phase of strontium barium silicate only by 87% or more. Particularly, the silicate phosphors further containing the merwinite crystal phase (Examples 1-8) give retention of emission strength at 150° C. higher than those of Comparison Examples 1-2 by 75% or more.

What is claimed is:

1. A green light-emitting silicate phosphor comprising Eu-activated strontium barium silicate which contains a crystal phase of magnesium oxide or a merwinite crystal phase.

2. The green light-emitting silicate phosphor of claim 1, which contains 0.15 to 0.90 mol of magnesium per one mol of silicon.

3. The green light-emitting silicate phosphor of claim 1, which contains both of a crystal phase of magnesium oxide and a merwinite crystal phase.

4. The green light-emitting silicate phosphor of claim 1, which has the crystal phase of magnesium oxide and gives an X-ray diffraction pattern given by utilizing CuKa ray of an angle 0 of incidence in which a relative strength of a diffraction peak attributed to the crystal phase of magnesium oxide in the region of 42.8° to 43.1° in terms of 2θ is in the range of 0.02 to 0.20 per 1 of a strength of diffraction peak attributed to crystal phase of the strontium barium silicate in the region of 31.3° to 31.6° in terms of 2θ.

5. The green light-emitting silicate phosphor of claim 1, which has the merwinite crystal phase and gives an x-ray diffraction pattern given by utilizing CuKa ray of an angle 0 of incidence in which a relative strength of a diffraction peak attributed to the merwinite crystal phase in the region of 32.4° to 32.7° in terms of 2θ is in the range of 0.02 to 0.50 per 1 of a strength of diffraction peak attributed to crystal phase of the strontium barium silicate in the region of 31.3° to 31.6° in terms of 2θ.

6. The green light-emitting silicate phosphor of claim 2, which is produced by calcining a powdery mixture comprising a powdery strontium compound, a powdery barium compound, a powdery silicon compound and a powdery europium compound in a ratio giving a Eu-activated green light-emitting phosphor and further comprising a powdery magnesium compound in an amount of 0.15 to 0.90 mol in terms of magnesium amount per one mol of the amount of silicon.

7. The green light-emitting silicate phosphor of claim 1, which releases a green light-emission showing an emission peak in the wavelength region of 510 to 530 nm when it is excited by a light having the wavelength of 400 rim and further releases a blue light-emission showing an emission peak in the wavelength region of 435 to 450 am in which the emission peak has an emission strength in the range of 0.0015 to 0.020 per 1 of the strength of the emission peak of the green light-emission.

* * * * *